(12) United States Patent
Okubo et al.

(10) Patent No.: US 8,021,804 B2
(45) Date of Patent: Sep. 20, 2011

(54) PHOTOMASK MANUFACTURING METHOD

(75) Inventors: Yasushi Okubo, Shinjuku-ku (JP);
Hisashi Kasahara, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 50 days.

(21) Appl. No.: 12/491,578

(22) Filed: Jun. 25, 2009

(65) Prior Publication Data
US 2009/0325083 A1    Dec. 31, 2009

(30) Foreign Application Priority Data

Jun. 27, 2008  (JP) ................................. 2008-168239

(51) Int. Cl.
*G03F 1/00*      (2006.01)
*G03F 9/00*      (2006.01)
(52) U.S. Cl. ............................................. 430/5; 430/22
(58) Field of Classification Search ................ 430/5, 22; 716/50, 53; 355/53, 72
See application file for complete search history.

(56) References Cited

U.S. PATENT DOCUMENTS

| 6,351,684 B1 * | 2/2002 | Shirley et al. ................. 700/121 |
| 2006/0292463 A1 * | 12/2006 | Best et al. ....................... 430/22 |
| 2009/0002720 A1 * | 1/2009 | Ehrenberg et al. ............ 356/615 |

FOREIGN PATENT DOCUMENTS

| JP | 2001-33941 A | 2/2001 |
| JP | 2002-116533 A | 4/2002 |
| JP | 2006-309143 A | 11/2006 |
| WO | 2005/079470 A2 | 9/2005 |

* cited by examiner

*Primary Examiner* — Stephen Rosasco
(74) *Attorney, Agent, or Firm* — Sughrue Mion, PLLC

(57) ABSTRACT

A photomask manufacturing method includes a defect information storage step of storing defect information of a mask blank, provided with an identification marker on an end face thereof, into an information storage device in correspondence to the identification marker, a placing orientation determination step of determining a placing orientation of the mask blank with respect to an exposure/writing apparatus, and an orientation correction step of performing rotation control of a rotating apparatus so that an orientation of the mask blank coincides with the determined placing orientation.

12 Claims, 7 Drawing Sheets

PHOTOMASK MANUFACTURING METHOD

This application is based upon and claims the benefit of priority from Japanese Patent Application No. 2008-168239, filed on Jun. 27, 2008, the disclosure of which is incorporated herein in its entirety by reference.

TECHNICAL FIELD

This invention relates to a photomask manufacturing method.

BACKGROUND ART

In advanced manufacturing of masks, there has been employed a technique that feeds back the quality of mask blanks being a material of the masks. For example, a method is known that performs pattern formation while avoiding a defective portion of a mask blank (see, e.g. Japanese Unexamined Patent Application Publication (JP-A) No. 2001-33941 (Patent Document 1)).

In order to perform such feedback, it is necessary to identify individual mask blanks. For this purpose, there have been proposed, for example, a mask blank formed with an identification marker for identifying or managing a mask blank glass substrate and a mask blank provided with an optically readable area code on an end face or the like of a mask blank glass substrate (see, e.g. Japanese Unexamined Patent Application Publication (JP-A) No. 2006-309143 (Patent Document 2)).

DISCLOSURE OF THE INVENTION

For performing pattern formation while avoiding a defective portion of a mask blank, defect information including the type and coordinates of a defect and so on is assigned to the mask blank, for example. Then, when producing a photomask, the defective portion is avoided based on the defect information. As a method of avoiding the defective portion, it is considered, for example, to use the mask blank by rotating it in a plane parallel to its main surface, thereby changing the orientation of the mask blank so as to avoid the position of the defect.

However, in the case of using, for example, a mask blank formed with an identification marker on an end face of a glass substrate of the mask blank, if the orientation of the mask blank is changed, the orientation of the end face formed with the identification marker also changes. As a result, the orientation of an end face formed with an identification marker differs per mask blank and thus it is difficult to manage the mask blanks.

Further, if the orientations of the end faces, each formed with the identification marker, of the mask blanks vary from each other, it is difficult to automatically read the identification markers using a sensor, for example, in a photomask manufacturing process. As a result, for example, there is also a possibility that it becomes difficult to automate the photomask manufacturing process.

It is therefore an object of this invention to provide a photomask manufacturing method that can solve the above-mentioned problems.

In order to solve the problem that the orientation of the end face formed with the identification marker changes by the rotation of the mask blank, it is considered to form the identification marker on all end faces of the glass substrate, for example. This makes it possible to read the identification marker from a fixed direction regardless of a rotation angle of the mask blank. In an exposure apparatus for transferring a mask pattern to a transfer target (a resist film on a wafer, or the like) using a photomask, when an identification marker is used for identification of the photomask instead of a conventionally used barcode in a blind area, it is preferable that the identification marker be formed on all end faces of a glass substrate. This is because, in the exposure apparatus, the placing orientation of a photomask when placing it on a mask stage is determined solely by the direction of a mask pattern formed on the photomask and, therefore, if, for example, an identification marker is provided on only one end face, it is unknown in which direction the identification marker is to be oriented when placed on the mask stage, so that a sensor cannot detect the identification marker.

On the other hand, the method of providing an identification marker on all end faces of a substrate is unsuitable for stages such as a process of obtaining defect information (defect position, defect type, defect size, etc.) of a mask blank, a process of exposing/writing a mask pattern in a resist film of the mask blank using an exposure/writing apparatus, and a process of inspecting, by the use of a mask inspection apparatus, a mask pattern of a photomask fabricated by developing the resist film and etching a mask pattern thin film. This is because, in these respective stages, a reference point for the orientation of a mask blank is necessary and it is preferable to use an identification marker as this reference point, while, if the identification marker is provided on all end faces of a substrate, the orientation of the mask blank cannot be identified by the identification marker. If the identification marker is provided on only one end face, it can be used as the reference point and, even if the identification marker is provided on two or three end faces, the orientation of the mask blank can be identified based on the relationship of the end faces with and without the identification marker. Naturally, it can also be dealt with by giving information, that can identify the orientation of the mask blank, to one of the identification markers on the four end faces. With this structure, however, there is a possibility of causing an increase in cost of the mask blank due to labor for designing a plurality of kinds of identification markers, complexity of the identification marker due to an increase in amount of information, and an increase in the number of processes for forming the identification marker on all end faces. Further, in advanced mask manufacturing where high quality is required, there is also a possibility that foreign matter or the like generated due to the formation of the identification markers cause defects. However, if the method of providing an identification marker on all end faces of a substrate is not used, there still remains the problem that an identification marker cannot be detected by a sensor depending on the placing orientation of a mask blank or a photomask. There is also a problem that it is not possible to prevent a human error caused by manually changing the orientation of a mask blank.

Under these circumstances, the inventors of this application have assiduously studied how to handle a mask blank in a photomask manufacturing process and have reached this invention that can solve those problems. This invention has the following structures.

(Structure 1)

A photomask manufacturing method of placing, on a placing portion of a rotating apparatus, a mask blank formed by stacking a mask pattern thin film and a resist film on a substrate in this order, placing the mask blank in an exposure/writing apparatus while controlling an orientation of the mask blank using the rotating apparatus, and exposing/writing a mask pattern in the resist film using the exposure/writing apparatus, the method comprising:

a defect information storage step of storing defect information into an information storage device in correspondence to an identification marker, the defect information including a type of a defect about at least one of the substrate, the mask pattern thin film, and the resist film in the mask blank provided with the identification marker on at least one end face of the substrate, and a position of the defect specified using a position of the identification marker as a reference;

a placing orientation determination step of determining a placing orientation of the mask blank with respect to the exposure/writing apparatus using an orientation of the identification marker as a reference; and an orientation correction step of performing rotation control of the rotating apparatus using the orientation of said identification marker as a reference so that an orientation of the mask blank on the placing portion coincides with the placing orientation determined in the placing orientation determination step, wherein the placing orientation determination step detects the identification marker of the mask blank placed on the placing portion using a sensor, refers to the information storage device to obtain the defect information, and determines, based on writing information of the mask pattern to be exposed/written by the exposure/writing apparatus and the defect information, the placing orientation that achieves an arrangement of the mask pattern on the substrate in which the defect does not adversely affect a pattern transfer function of a photomask produced from the mask blank.

An orientation of an identification marker represents, for example, a direction in which an end face formed with the identification marker is oriented. Determining a placing orientation using an orientation of an identification marker as a reference represents, for example, that a direction in which an end face formed with the identification marker should be oriented is determined as a placing orientation. The orientation correction step orients the end face formed with the identification marker in the placing orientation, for example, by controlling the rotation of a rotary driving apparatus. An arrangement of a mask pattern on a substrate in which a defect does not adversely affect a pattern transfer function of a photomask represents, for example, an arrangement in which there occurs no defect that causes a problem in a mask inspection for the photomask. A position of a defect specified using a position of an identification marker as a reference represents, for example, a position of a defect specified so that the relative position with respect to the identification marker can be calculated. This defect position may be, for example, a position in which the relative position with respect to the identification marker is specified by a known coordinate system.

The placing orientation is, for example, an orientation in which the mask blank is placed with respect to the exposure/writing apparatus at the time of the exposure/writing. The rotating apparatus is provided, for example, in the exposure/writing apparatus. In this case, the placing orientation determination step and the orientation correction step determine the placing orientation and control the rotation, respectively, with respect to the mask blank placed in the exposure/writing apparatus, for example. The rotating apparatus may alternatively be provided outside the exposure/writing apparatus. In this case, the placing orientation determination step and the orientation correction step determine the placing orientation and control the rotation, respectively, with respect to the mask blank before placement in the exposure/writing apparatus, for example.

The exposure/writing apparatus exposes/writes the mask pattern, for example, by EB exposure/writing that irradiates an electron beam onto the resist film. The identification marker is, for example, an optically readable identification marker. As the identification marker, use can be appropriately made of a two-dimensional code such as, for example, Data Matrix, QR code, SP code, VeriCode, MaxiCode, CP code, Codel, AztecCode, INTACTA Code, or Card-e.

The identification marker is preferably formed in a region having no influence on pattern transfer at the time of using the photomask manufactured from the mask blank. The identification marker is formed on at least an end face of the substrate. An end face referred to herein represents, to say nothing of an end face of the substrate in a narrow sense, a chamfered surface formed between the main surface and the end face, a notch mark forming portion, or even the main surface in a peripheral region near the end faces which is a region having no influence when fabricating the photomask.

With this structure, it is possible to properly manage the orientation of the mask blank, for example. Accordingly, it is possible to prevent the orientations of end faces, each formed with an identification marker, of mask blanks from varying from each other and thus to securely detect the identification marker using the sensor. This makes it possible, for example, to properly automate the photomask manufacturing process. Further, it is possible to properly carry out the rotation of the mask blank and thus to properly form the mask pattern while avoiding the defect. This makes it possible to improve the manufacturing yield of photomasks.

Herein, the orientation correction step rotates the mask blank by a rotation angle of, for example, one of 0, 90, 180, and 270 degrees according to the placing orientation determined in the placing orientation determination step. The rotation by a rotation angle of 0 degrees is, for example, an operation of maintaining the orientation of the mask blank without rotating the mask blank.

The automation of the photomask manufacturing process is, for example, processing the mask blank into the photomask without human power by automatically rotating the orientation of the mask blank between respective apparatuses used in the photomask manufacturing process and automatically carrying out the operations in the respective apparatuses. The mask blank or the photomask after the manufacture is transferred between the respective apparatuses in a state of being placed in a case. As this case, use is made of, for example, an one-by-one case adapted to place the single mask blank or photomask therein.

In order to expose/write the mask pattern while avoiding the defect, it is also considered to rotate the mask pattern without rotating the mask blank, for example. In this case, however, it is necessary to prepare in advance a plurality of kinds of data corresponding to respective rotation angles as data of the mask pattern, for example. However, the preparation of the data of the mask pattern (design data such as CAD data) is the work of much labor and time requiring many calculation processes such as, for example, optical proximity correction (OPC). Further, normally, an exposure/writing apparatus cannot perform exposure/writing with design data as it is and, therefore, it is necessary to convert all design data into writing command data that can be recognized by the exposure/writing apparatus. Further, this conversion needs to be carried out for all design data prepared for the respective rotation angles. Therefore, if the plurality of kinds of data need to be prepared, there is a possibility that the burden of preparation of the photomask manufacturing process becomes very large. In contrast, according to Structure 1, it is possible to expose/write the mask pattern while avoiding the defect without considerably increasing the burden of preparation, for example.

(Structure 2)

The photomask manufacturing method according to Structure 1, further comprising an orientation restoration step of placing, on the placing portion, the mask blank subjected to exposure/writing of the mask pattern in the resist film using said exposure/writing apparatus and performing rotation control of the rotating apparatus to restore the orientation of the identification marker to a state before the orientation correction step.

According to Structure 2, even if, for example, the mask blank is rotated anyway before performing the exposure/writing, the mask blank can be oriented in the fixed direction thereafter. This makes it possible, for example, to more properly prevent the orientations of end faces, each formed with an identification marker, of mask blanks from varying from each other. Therefore, for example, when reading the identification marker in a step subsequent to the orientation restoration step, it is possible to securely detect the identification marker using a sensor. This makes it possible, for example, to more properly automate the photomask manufacturing process.

(Structure 3)

The photomask manufacturing method according to Structure 2, further comprising:

an inspection pattern data transmission step of placing, on a mask placing portion of a mask rotating apparatus, the photomask produced by developing the resist film after the exposure/writing of the mask pattern and etching the mask pattern thin film, detecting the identification marker using a sensor, referring to the information storage device to obtain inspection pattern data corresponding to the photomask, and transmitting the inspection pattern data to a mask inspection apparatus; and a mask orientation correction step of performing rotation control of the mask rotating apparatus using the orientation of the identification marker as a reference so that an orientation of the photomask on the mask placing portion coincides with the placing orientation of the mask blank determined in the placing orientation determination step.

According to Structure 3, it is possible, for example, to rotate the photomask before a mask inspection of the photomask using the mask inspection apparatus so as to agree with the orientation of the mask blank at the time of the exposure/writing of the mask pattern. This makes it possible, for example, to properly collate the mask pattern thin film after the etching with the inspection pattern data in the mask inspection apparatus.

(Structure 4)

The photomask manufacturing method according to Structure 3, further comprising a mask orientation restoration step of placing, on the mask placing portion, the photomask subjected to a mask inspection using the mask inspection apparatus and performing rotation control of the mask rotating apparatus to restore the orientation of the identification marker to a state before the mask orientation correction step.

According to Structure 4, the photomask after the mask inspection can be oriented in the fixed direction, for example. This makes it possible, for example, to more properly prevent the orientations of end faces, each formed with an identification marker, of photomasks from varying from each other. This makes it possible, for example, to more properly automate the photomask manufacturing process.

According to this invention, based on defect information of a mask blank in which the position of a defect is specified using an identification marker as a reference, the placing orientation (writing direction) of the mask blank in an exposure/writing apparatus can be automatically controlled using a rotating apparatus so that the layout or arrangement of a mask pattern to be transferred to a mask pattern thin film is not adversely affected by the defect. This makes it possible to solve the problem of human error otherwise caused by manually rotating the orientation of the mask blank or a photomask produced therefrom. Further, even without using the method of providing an identification marker on all end faces of a substrate, the orientation of the mask blank or the photomask can be rotation-controlled using the rotating apparatus and thus the identification marker can be securely detected using a sensor.

Further, also in the case of performing a mask inspection of the produced photomask, the placing orientation of the photomask in a mask inspection apparatus can be automatically controlled using a mask rotating apparatus by storing, in an information storage device, the placing orientation of the mask blank in the exposure/writing apparatus at the time of exposure/writing on the mask blank.

DESCRIPTION OF THE EXEMPLARY EMBODIMENT

Figure 1A:
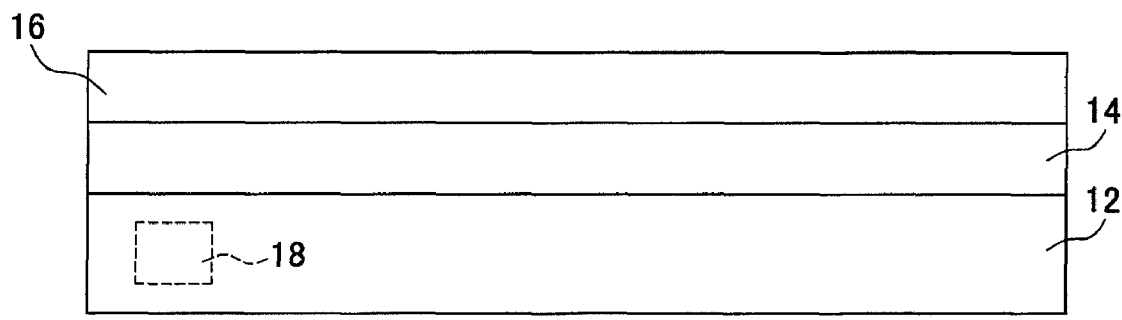
FIG. 1A is a diagram showing an example of the structure of a mask blank 10 for use in a photomask manufacturing method according to an embodiment of this invention.

Hereinbelow, an embodiment according to this invention will be described with reference to the drawings. FIG. 1A shows an example of the structure of a mask blank 10 for use in a photomask manufacturing method according to an embodiment of this invention.

The mask blank 10 is a mask blank having a mask pattern thin film 14 and a resist film 16 stacked in this order on a substrate 12.

The substrate 12 is a mask blank glass substrate and is made of, for example, a synthetic quartz glass. The substrate 12 may alternatively be made of a $SiO_2$—$TiO_2$-based low thermal expansion glass, a crystallized glass with a β-quartz solid solution precipitated, a soda-lime glass, or the like. The substrate 12 has main surfaces and end faces each polished to a mirror surface with a predetermined surface roughness. In this example, an identification marker 18 is formed on one of the end faces of the substrate 12. The mask pattern thin film 14 is a light-shielding film, a light-semitransmissive film, or the like for forming a mask pattern in a photomask manufacturing process and is formed on the substrate 12. The mask pattern thin film 14 may be a laminated film of a plurality of kinds of thin films. The resist film 16 is a resist film that will be used in a photolithography process for patterning the mask pattern thin film 14. The resist film 16 may be formed in the photomask manufacturing process, for example. The mask blank 10 is used for manufacturing a mask for photolithography. This mask is a light transmissive mask for use with, for example, an ArF excimer laser (wavelength: 193 nm). With a structure such that a low thermal expansion glass is used as a material of the substrate 12, for example, and, instead of the mask pattern thin film 14, a multilayer reflective film, for example, with multicycles of Mo and Si layers, each cycle being formed by a Mo layer and a Si layer, is formed on the substrate 12, a cap film made of Ru or the like and a buffer film mainly containing Cr or the like are formed on the multilayer reflective film, and further an absorbent film mainly containing Ta or the like is formed thereon, it is applicable to a reflective mask for extreme ultraviolet (EUV) exposure, which is used in reflective lithography using EUV light as a light source.

Figure 1B:
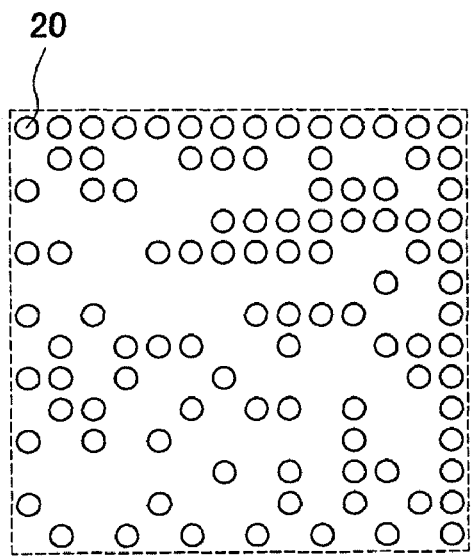
FIG. 1B is a diagram showing an example of the structure of an identification marker 18.

FIG. 1B shows an example of the structure of the identification marker 18. The identification marker 18 indicates identification information, for example, an identification code such as an identification number or identification symbols or a managing code such as a managing number or managing symbols, unique to the mask blank 10. The identification marker 18 is formed, for example, by irradiation of laser light of a carbon dioxide laser, for example, in a mask blank glass substrate manufacturing process. In this example, the identification marker 18 is an optically readable two-dimensional code expressed by a two-dimensional array of pits 20. In this example, this two-dimensional code is in the form of a data matrix.

Further, in this example, the identification marker 18 is made to correspond or relate to defect information of the mask blank 10, for example, in a defect information storage process carried out in the photomask manufacturing process. The defect information storage process stores the defect information into an information storage device in correspondence to the identification marker 18, for example. The defect information is information including, for example, the type of a defect about at least one of the substrate 12, the mask pattern thin film 14, and the resist film 16 and the position of the defect specified using the position of the identification marker 18 as a reference. The position of the defect is, for example, such that the relative position with respect to the identification marker 18 is specified by a known coordinate system.

Hereinbelow, the photomask manufacturing process carried out using the mask blank 10 will be described in further detail. In this example, the photomask manufacturing process is semiautomated. The mask blank 10 or a photomask after the manufacture is transferred between apparatuses in a state of being placed in a case.

Figure 2:
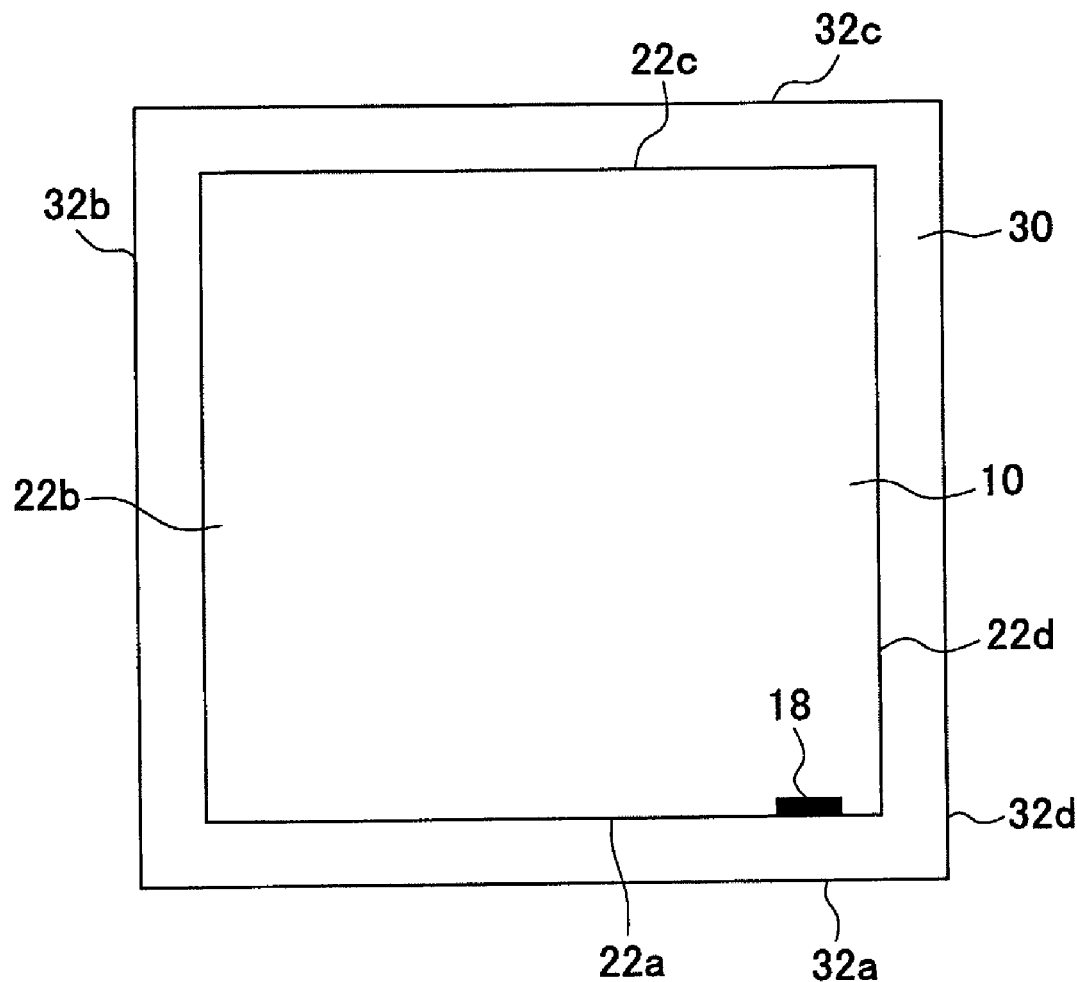
FIG. 2 is a diagram showing an example of the structure of a case 30 for placing the mask blank 10 therein for transfer between apparatuses.

FIG. 2 shows an example of the structure of a case 30 for placing the mask blank 10 therein for transfer between the apparatuses. The case 30 is an one-by-one case for placing the single mask blank 10 or photomask (hereinafter referred to as the mask blank 10 or the like) therein and protects the mask blank 10 or the like between processes by placing the mask blank 10 or the like therein. In this example, the case 30 has sides 32a to 32d that become parallel to end faces 22a to 22d, respectively, of the mask blank 10 when the mask blank 10 is placed therein. The sides 32a to 32d are distinguishable from each other and the mask blank 10 is placed in the case 30 with the end face 22a formed with the identification marker 18 being parallel to one of the sides 32a to 32d. In the state shown in FIG. 2, the side 32a of the case 30 is parallel to the end face 22a of the mask blank 10. Accordingly, the mask blank 10 is placed in the case 30 in a state where the end face 22a of the mask blank 10 faces or is oriented in the direction of the side 32a of the case 30. If the orientation of the end face 22a of the mask blank 10 relative to the case 30 is identifiable, a known one-by-one case may be used as the case 30, for example.

Figure 3:
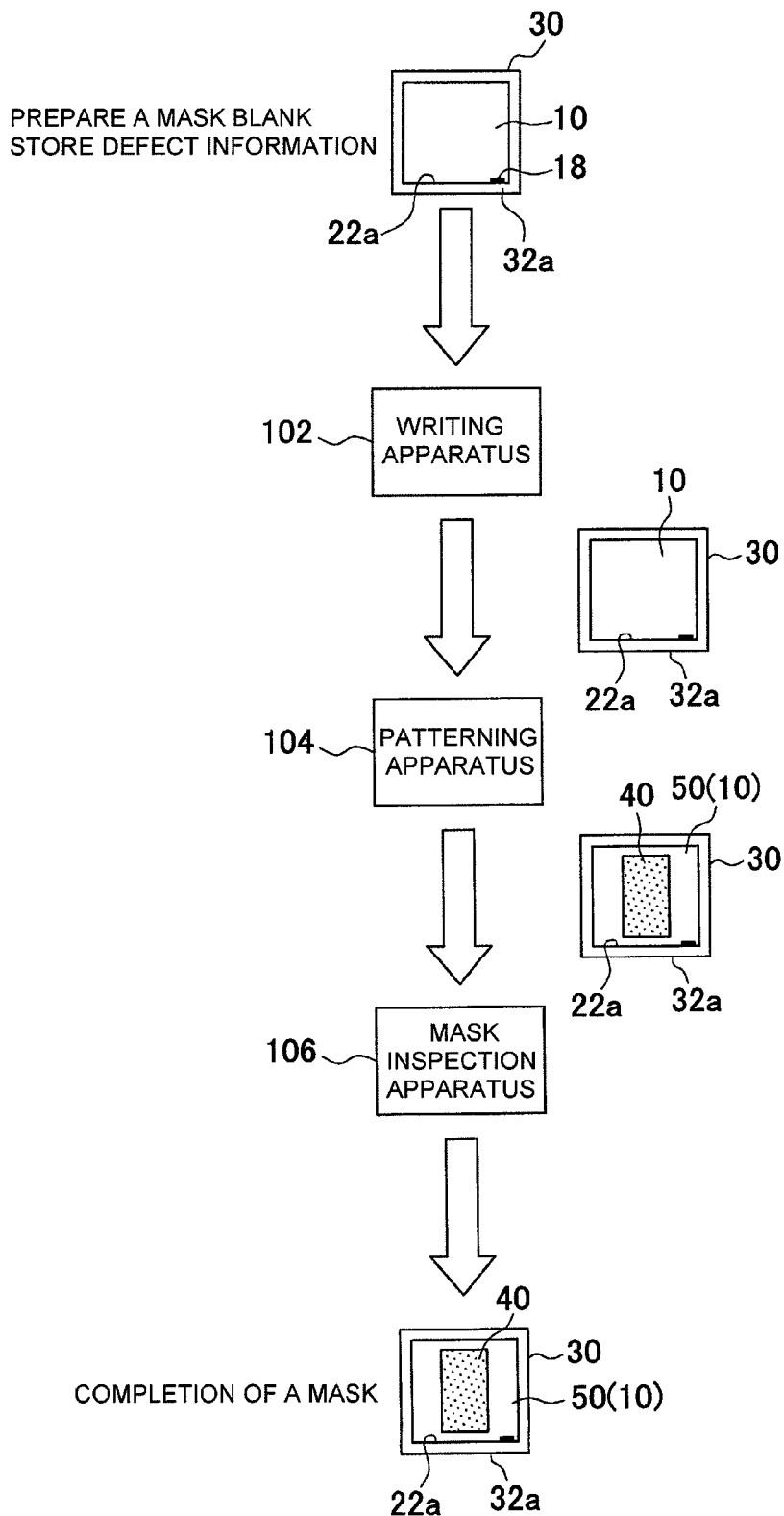
FIG. 3 is a diagram showing a first example of a photomask manufacturing process.

FIG. 3 shows a first example of the photomask manufacturing process. In the photomask manufacturing process of this example, the defect information storage process of storing defect information is first carried out in respective processes of preparing a mask blank 10. Specifically, first, there is prepared a substrate 12 formed with an identification marker 18 and having main surfaces and end faces each polished to a predetermined surface roughness and then a defect inspection is carried out for the substrate 12 using a substrate defect inspection apparatus, thereby obtaining defect information of the substrate 12, such as the position of a defect in a coordinate system of the substrate defect inspection apparatus associated with the position of the identification marker 18, the type of a defect, and the size of a defect, and storing the defect information into the information storage device in correspondence to the identification marker 18. Then, a mask pattern thin film 14 is formed on the substrate 12 under predetermined conditions and a defect inspection is carried out for the mask pattern thin film 14 using a thin film defect inspection apparatus, thereby obtaining defect information of the mask pattern thin film 14, such as the position of a defect in a coordinate system of the thin film defect inspection apparatus associated with the position of the identification marker 18, the type of a defect, and the size of a defect, and storing the defect information into the information storage device in correspondence to the identification marker 18. In this event, if the mask pattern thin film 14 has a multilayer structure such as, for example, a two-layer structure in which a phase shift film is formed on the substrate 12 using a film forming apparatus and then a light-shielding film is formed using another film forming apparatus, a defect inspection is carried out for each of the films using a predetermined defect inspection apparatus, thereby likewise storing defect information into the information storage device in correspondence to the identification marker 18. Further, a resist film 16 is coated on the mask pattern thin film 14 under predetermined conditions and a defect inspection is carried out for the resist film 16 using a resist defect inspection apparatus, thereby obtaining defect information of the resist film 16, such as the position of a defect in a coordinate system of the resist defect inspection apparatus associated with the position of the identification marker 18, the type of a defect, and the size of a defect, and storing the defect information into the information storage device in correspondence to the identification marker 18.

The respective defect information of the substrate 12, the mask pattern thin film 14, and the resist film 16 may be collated into defect information identifying the defect positions expressed in a single coordinate system and stored into the information storage device. In the case where the defect information of all of the substrate 12, the mask pattern thin film 14, and the resist film 16 is not necessary when manufacturing a photomask, only the necessary defect information may be stored into the information storage device. For example, in the case of a photomask for exposure with long-wavelength light, there are instances where the defect information of the substrate 12 is not required, and in this instance, the defect information of only the mask pattern thin film 14 and the resist film 16 may be stored into the information storage device. It is not necessary that the information storage device used in the processes of preparing a mask blank and the information storage device used in the processes of manufacturing a photomask be the same. When the information storage devices are individually provided, defect information may be transferred to the information storage device used in the processes of manufacturing the photomask by the use of a communication network such as the Internet or a storage medium such as FD, CD, or DVD.

The mask blank 10 whose defect information is stored in the information storage device in correspondence to the identification marker 18 as described above is placed into a case 30. For example, the mask blank preparing process places the mask blank 10 into the case 30 in a state where an end face 22a of the mask blank 10 is oriented in the direction of a side 32a of the case 30.

Subsequently, the mask blank 10, being placed in the case 30, is carried, manually or using a conveyor apparatus, to an exposure/writing apparatus 102 that performs exposure/writing of a mask pattern. In the exposure/writing apparatus 102, respective processes are carried out. In this example, the exposure/writing apparatus 102 has a rotating apparatus provided with a placing portion for placing the mask blank 10 thereon. As this rotating apparatus, it is preferable to use a robot arm having a placing portion on which the mask blank 10 can be placed. The rotating apparatus may be configured as a rotary table provided with a rotary driving apparatus, but in this case, an apparatus for taking the mask blank 10 out of the case 30 and placing it on the rotary table is separately required. Hereinbelow, a description will be given of the case where the robot arm is used as the rotating apparatus. The exposure/writing apparatus 102 causes the robot arm (rotating apparatus) to take the mask blank 10 out of the case 30 and place the mask blank 10 on the placing portion and then to rotate the mask blank 10 while controlling the orientation thereof. Then, after rotating the mask blank 10, the exposure/writing apparatus 102 causes the robot arm to place the mask blank 10 on a writing stage of the exposure/writing apparatus 102 while maintaining the orientation thereof as it is and then exposes/writes a mask pattern in the resist film 16 of the mask blank 10.

Then, after the exposure/writing, the exposure/writing apparatus 102 causes the robot arm to remove the mask blank 10 from the writing stage and place it on the placing portion, then to rotate again the mask blank 10 to restore the orientation of the mask blank 10 to the orientation before the initial rotation by the robot arm, and then to place the mask blank 10 with the restored orientation into the case 30. Accordingly, the exposure/writing apparatus 102 sends out the mask blank 10 to a next process in a state where the end face 22a formed with the identification marker 18 is oriented in the fixed direction. In this example, the exposure/writing apparatus 102 sends out the mask blank 10 after the exposure/writing to a patterning apparatus 104. The respective processes performed in the exposure/writing apparatus 102 will be described in further detail later.

The patterning apparatus 104 is an apparatus for carrying out respective processes of photolithography such as, for example, development after the exposure/writing and etching and performs patterning of the mask pattern thin film 14 according to the mask pattern exposed/written by the exposure/writing apparatus 102. By this patterning, a mask pattern 40 is formed so that the mask blank 10 is processed into a photomask 50.

In this example, the patterning apparatus 104 causes a robot arm or the like to take the mask blank 10, placed into the case 30 by the preceding exposure/writing apparatus 102, out of the case 30 before carrying out the patterning, for example.

After carrying out the patterning, the patterning apparatus 104 causes the robot arm or the like to place the mask blank 10 (photomask 50) into the case 30 in a state where the end face 22a formed with the identification marker 18 is oriented in the predetermined direction. Accordingly, the patterning apparatus 104 sends out the photomask 50 to a next process in a state where the end face 22a formed with the identification marker 18 is oriented in the fixed direction. In this example, the patterning apparatus 104 sends out the photomask 50 after the patterning to a mask inspection apparatus 106.

The mask inspection apparatus 106 is an inspection apparatus for inspecting the mask pattern thin film 14 after the patterning and, using inspection pattern data corresponding to the photomask 50, it collates the mask pattern thin film 14 subjected to the patterning with the inspection pattern data. In this example, the mask inspection apparatus 106 has a mask rotating apparatus provided with a mask placing portion for placing the photomask 50 thereon. As this mask rotating apparatus, it is preferable to use a robot arm having a mask placing portion on which the photomask 50 can be placed. The mask rotating apparatus may be configured as a mask rotating table provided with a rotary driving apparatus, but in this case, an apparatus for taking the photomask 50 out of the case 30 and placing it on the mask rotating table is separately required. Hereinbelow, a description will be given of the case where the robot arm is used as the mask rotating apparatus. The mask inspection apparatus 106 causes the robot arm (mask rotating apparatus) to take the photomask 50 out of the case 30 and place the photomask 50 on the mask placing portion, then to rotate the photomask 50 so as to agree with the placing orientation of the mask blank 10 for the exposure/writing of the mask pattern described above, and then to place the photomask 50 on an inspection stage of the mask inspection apparatus 106, thereby making collation with the inspection pattern data.

Then, after the inspection, the mask inspection apparatus 106 causes the robot arm to remove the photomask 50 from the inspection stage and place it on the mask placing portion, then to rotate again the photomask 50 to restore the orientation of the photomask 50 to the orientation before the initial rotation by the robot arm of the mask inspection apparatus 106, and then to place the photomask 50 with the restored orientation into the case 30. Accordingly, with respect to the photomask 50 after the inspection, the mask inspection apparatus 106 is adapted to orient the end face 22a formed with the identification marker 18 in the fixed direction. The respective processes performed in the mask inspection apparatus 106 will also be described in further detail later.

Through the processes described above, the photomask 50 of this example is manufactured. Except what is described above and below, the exposure/writing apparatus 102, the patterning apparatus 104, and the mask inspection apparatus 106 may be the same as or similar to a known exposure/writing apparatus, patterning apparatus, and mask inspection apparatus. When, for example, patterning the mask pattern thin film 14 a plurality of times, the processes performed in the exposure/writing apparatus 102 and the processes performed in the patterning apparatus 104 may be repeated a plurality of times.

Figure 4:
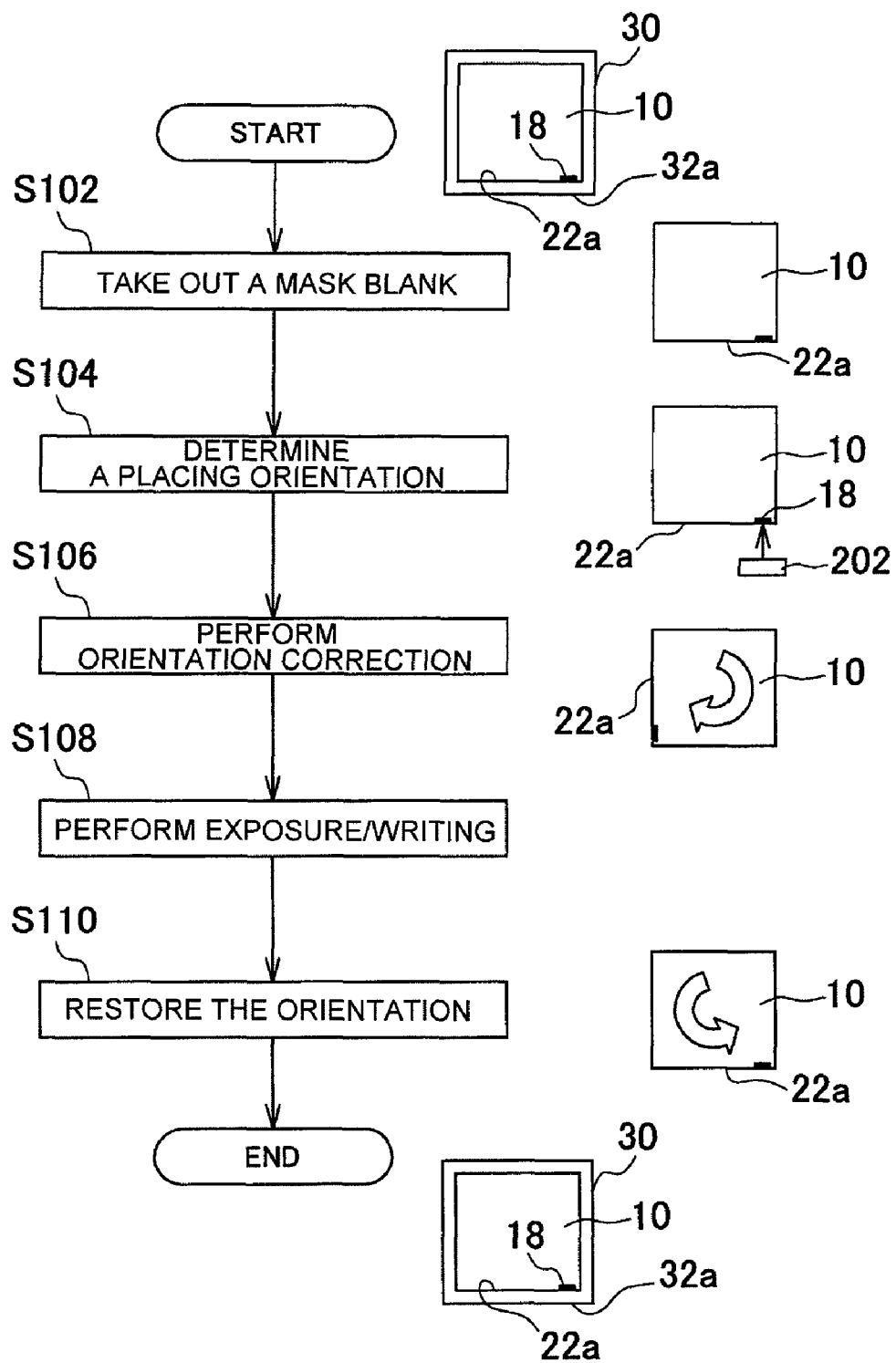
FIG. 4 is a flowchart showing, in further detail, respective processes performed in an exposure/writing apparatus 102.

FIG. 4 is a flowchart showing, in further detail, the respective processes performed in the exposure/writing apparatus 102. In this example, the exposure/writing apparatus 102 has a sensor 202 being a reader for optically reading an identification marker 18 from a predetermined direction. The sensor 202 is provided at a position facing a side 32a of a case 30 placing a mask blank 10 therein and reads an identification marker 18 provided on an end face, oriented in the direction of the side 32a, among end faces 22a to 22d of the mask blank 10. In this example, the mask blank 10 received by the exposure/writing apparatus 102 is placed in the case 30 with the end face 22a oriented in the direction of the side 32a of the case 30. The exposure/writing apparatus 102 has the robot arm (rotating apparatus) provided with the placing portion for placing the mask blank 10 thereon and causes the robot arm to properly rotate the mask blank 10 placed on the placing portion.

In this example, the exposure/writing apparatus 102 first receives the mask blank 10, whose defect information has been stored in the defect information storage process, in a state of being placed in the case 30 and causes the robot arm to take the mask blank 10 out of the case 30 and place it on the placing portion (S102). Then, the exposure/writing apparatus 102 performs a placing orientation determination process to determine a placing orientation, being an orientation in which the mask blank 10 is placed with respect to the exposure/writing apparatus 102 at the time of mask pattern exposure/writing, using the orientation of the identification marker 18 as a reference (S104). In the placing orientation determination process, the exposure/writing apparatus 102 first detects, using the sensor 202, the identification marker 18 of the mask blank 10 placed on the placing portion of the exposure/writing apparatus 102. Then, the exposure/writing apparatus 102 refers to the information storage device storing the defect information and obtains the defect information. Then, based on writing information of a mask pattern to be exposed/written by the exposure/writing apparatus 102 and the obtained defect information, the exposure/writing apparatus 102 determines a placing orientation of the mask blank 10 on the placing portion in which a defect does not adversely affect the pattern transfer function of a photomask produced from the mask blank 10.

Herein, for example, if the end face 22a formed with the identification marker 18 in the mask blank 10 is oriented in the direction of one of the sides 32b to 32d other than the side 32a, the sensor 202 cannot read the identification marker 18. However, in this example, the exposure/writing apparatus 102 receives the mask blank 10 placed in the case 30 with the end face 22a oriented in the direction of the side 32a of the case 30. Therefore, according to this example, the sensor 202 can properly read the identification marker 18. Even if the mask blank 10 is placed in the case 30 with the end face 22a oriented in the direction of other than the side 32a due to some problem in the preceding process, the identification marker 18 can be read by repeating a sequence of rotating the mask blank 10 by 90 degrees using the robot arm and performing a read operation using the sensor 202, so that the orientation of the mask blank 10 on the placing portion can be corrected to the initial orientation.

Subsequent to the placing orientation determination process, the exposure/writing apparatus 102 performs an orientation correction process (S106). In the orientation correction process, the exposure/writing apparatus 102 controls the rotation of the rotary driving apparatus using the orientation of the identification marker 18 as a reference so that the orientation of the mask blank 10 on the placing portion coincides with the placing orientation determined in the placing orientation determination process. The exposure/writing apparatus 102 rotates the mask blank 10 by a rotation angle of, for example, one of 0, 90, 180, and 270 degrees according to the determined placing orientation.

Then, the exposure/writing apparatus 102 causes the robot arm to place the mask blank 10 on the writing stage of the exposure/writing apparatus 102 while maintaining the orientation thereof as it is and then performs a writing process (S108). In the writing process, the exposure/writing apparatus 102 performs electron beam (EB) exposure/writing to irradiate an electron beam onto the resist film 16. In this manner, the exposure/writing apparatus 102 performs exposure/writing of a mask pattern with respect to the mask blank 10 oriented in the placing orientation.

Then, the exposure/writing apparatus 102 performs an orientation restoration process (S110). In the orientation restoration process, the exposure/writing apparatus 102 causes the robot arm to remove the mask blank 10 from the writing stage and place it on the placing portion and then to perform rotation control to restore the orientation of the identification marker 18 to the state before the orientation correction process. Further, in the orientation restoration process of this example, the exposure/writing apparatus 102 causes the robot arm to place the mask blank 10 with the restored orientation into the case 30 while maintaining the orientation thereof as it is. Then, after placing the mask blank 10 into the case 30, the exposure/writing apparatus 102 sends out the mask blank 10 to the next process.

According to this example, even if, for example, the mask blank 10 is rotated anyway before performing the exposure/writing, the mask blank 10 can be oriented in the fixed direction thereafter. Therefore, for example, it is possible to properly prevent the orientations of end faces 22a, each formed with an identification marker 18, of mask blanks 10 from varying from each other.

This makes it possible, for example, to automatically read the identification marker 18 using a reader like the sensor 202 in the patterning apparatus 104 or the like that carries out subsequent processes. Then, for example, based on the read identification marker 18, it is possible to automatically carry out patterning or the like. Therefore, according to this example, the photomask manufacturing process can be properly automated, for example.

Further, in this example, it is possible, for example, to properly carry out the rotation of the mask blank 10 before the exposure/writing without causing any problem in reading the identification marker 18 in the subsequent processes. Therefore, for example, it is possible to perform the exposure/writing while orienting the mask blank 10 in a direction corresponding to its own defect information. This makes it possible, for example, to improve the manufacturing yield of photomasks.

As described above with reference to FIG. 3, in this example, the end face 22a formed with the identification marker 18 is oriented in the predetermined direction even at the time of completion of the processes performed in the patterning apparatus 104. Therefore, in this example, even in the processes subsequent to the processes performed in the patterning apparatus 104, there arises no problem in reading the identification marker 18, for example. Therefore, according to this example, the photomask manufacturing process can be more properly automated.

Figure 5A:
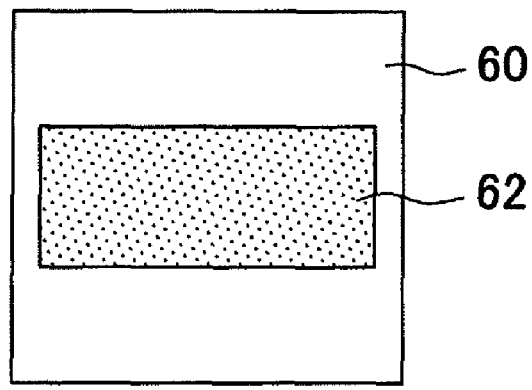
FIG. 5A schematically shows an example of pattern data 60 indicative of a mask pattern 62 to be exposed/written.
Figure 5B:
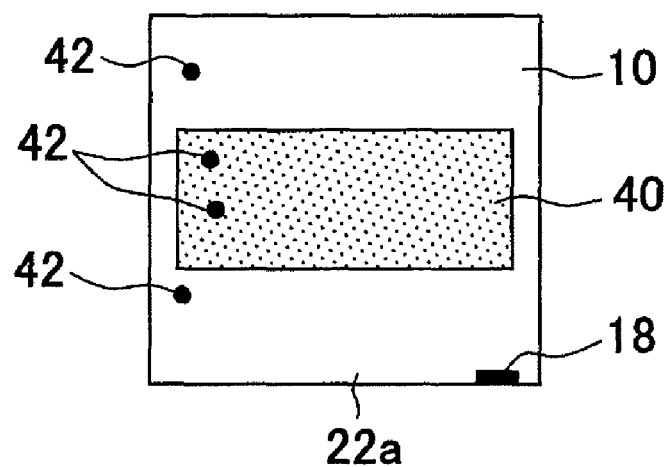
FIG. 5B shows an example of a state of a mask blank 10 after exposure/writing when the exposure/writing was carried out without rotation of the mask blank 10.
Figure 5C:
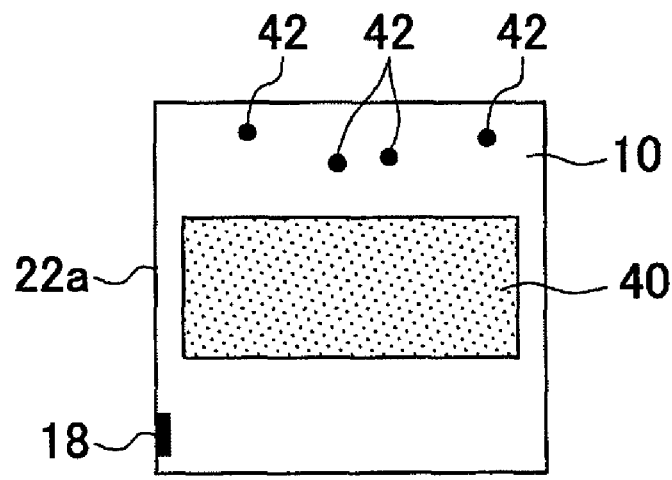
FIG. 5C shows an example of a state of a mask blank 10 after exposure/writing when the exposure/writing was carried out with rotation of the mask blank 10.

FIGS. 5A to 5C are diagrams for explaining the rotating operation of the mask blank 10 in further detail. FIG. 5A schematically shows an example of pattern data 60 indicative of a mask pattern 62 to be exposed/written. In this example, the pattern data 60 is data indicative of information of the mask pattern 62 to be formed in a partial region of the main surface of the mask blank 10.

FIGS. 5B and 5C each show an example of a state of the mask blank 10 after exposure/writing of a mask pattern 40. In this example, the mask pattern 40 is exposed/written in a region, corresponding to the mask pattern 62 of the pattern data 60, of the main surface of the mask blank 10. It may happen that the mask blank 10 has a defect in a partial region thereof. This defect is, for example, a defect of the substrate 12 or the mask pattern thin film 14 in the mask blank 10. The defect may be a defect of the mask pattern thin film 14 generated by a defect of the resist film 16 of the mask blank 10. For example, in the illustrated case, the mask blank 10 has a plurality of defects 42 in a partial region thereof.

FIG. 5B shows the example of the state of the mask blank 10 after the exposure/writing of the mask pattern 40 when the exposure/writing of the mask pattern 40 was carried out without rotation of the mask blank 10. In the state shown in FIG. 5B, part of the defects 42 are present in the region where the mask pattern 40 is to be formed. Therefore, if the mask pattern 40 is exposed/written in this state, the defects 42 in the region where the mask pattern 40 is to be formed adversely affect the pattern transfer function of a photomask. Thus, in this state, the photomask 50 cannot be properly formed.

FIG. 5C shows the example of the state of the mask blank 10 after the exposure/writing of the mask pattern 40 when the exposure/writing of the mask pattern 40 was carried out with rotation of the mask blank 10. In this state, the mask blank 10 is rotated so that the end face 22 formed with the identification marker 18 faces the left side in the figure, from the state shown in FIG. 5B where the end face 22a faces downward in the figure. By rotating the mask blank 10 in this manner, all the defects 42 in the mask blank 10 can be located outside the region where the mask pattern 40 is to be formed, for example. Accordingly, this makes it possible to expose/write the mask pattern 40 with the layout or arrangement in which the defects 42 do not adversely affect the pattern transfer function of a photomask. Thus, it is possible, for example, to properly carry out patterning of the mask pattern 40 even if the defects 42 are present at a part of the main surface of the mask blank 10.

Figure 6:
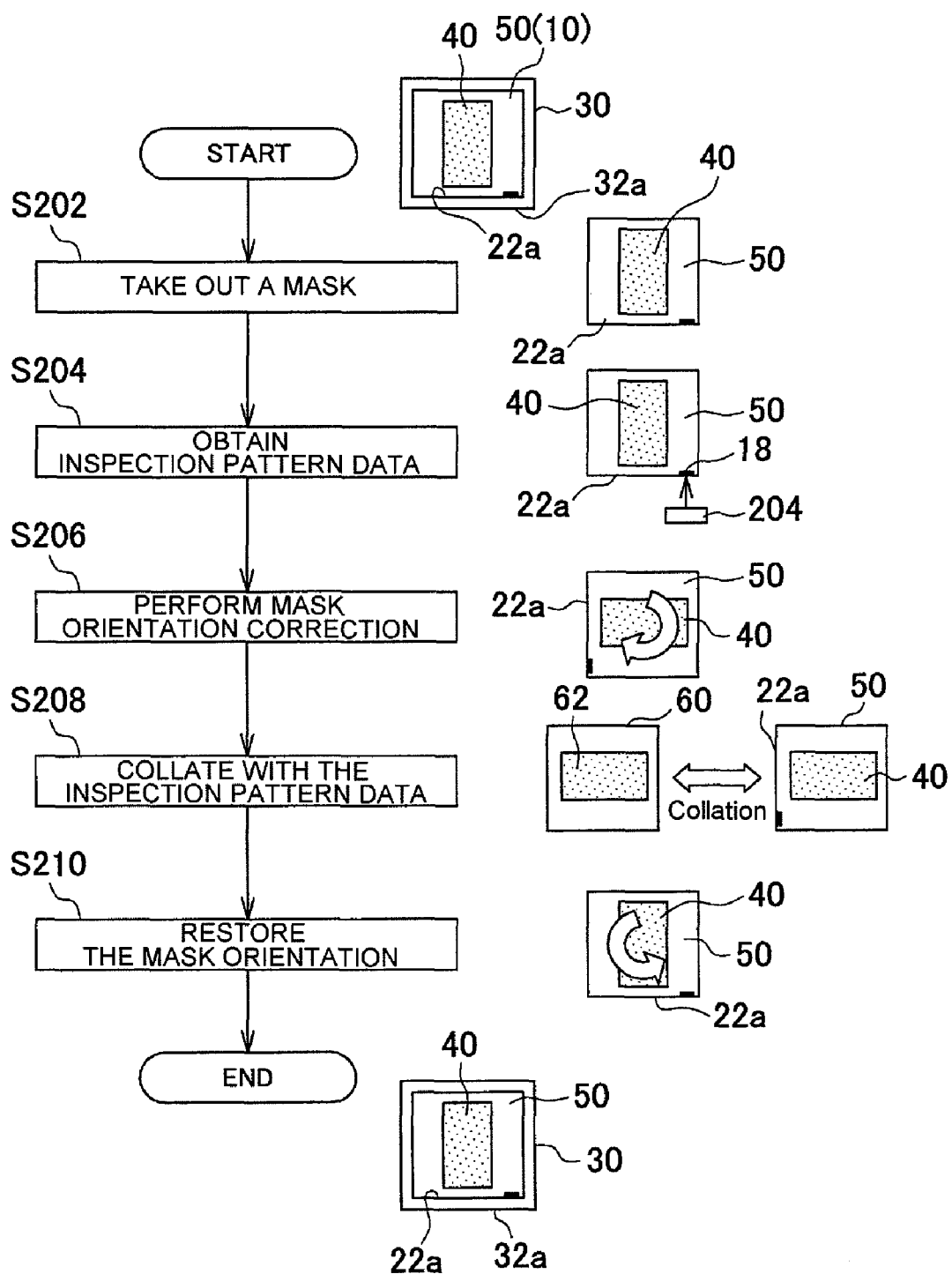
FIG. 6 is a flowchart showing, in further detail, respective processes performed in a mask inspection apparatus 106.

FIG. 6 is a flowchart showing, in further detail, the respective processes performed in the mask inspection apparatus 106. In this example, the mask inspection apparatus 106 inspects the photomask 50 taking into account the rotation angle by which the mask blank 10 was rotated before the exposure/writing. The mask inspection apparatus 106 has the robot arm (mask rotating apparatus) provided with the mask placing portion for placing the photomask 50 thereon and a sensor 204 for the identification marker 18. The robot arm provided with the mask placing portion and the sensor 204 have the same or similar structures as those of the robot arm and the sensor 202 (see FIG. 4) in the exposure/writing apparatus 102, for example.

In this example, the mask inspection apparatus 106 first receives the photomask 50, having been subjected to the respective processes in the patterning apparatus 104, in a state of being placed in the case 30. Then, the mask inspection apparatus 106 causes the robot arm to take the photomask 50 out of the case 30 and place it on the mask placing portion (S202) and then performs an inspection pattern data transmission process (S204). In the inspection pattern data transmission process, the mask inspection apparatus 106 first detects, using the sensor 204, the identification marker 18 of the photomask 50 in a state of being placed on the mask placing portion. Then, the mask inspection apparatus 106 refers to the information storage device storing inspection pattern data and transmits inspection pattern data corresponding to the photomask 50 to the mask inspection apparatus 106. In this manner, the mask inspection apparatus 106 obtains the inspection pattern data.

Then, the mask inspection apparatus 106 performs a mask orientation correction process (S206). In the mask orientation correction process, the mask inspection apparatus 106 performs rotation control of the robot arm using the orientation of the identification marker 18 as a reference so that the orientation of the photomask 50 on the mask placing portion coincides with the placing orientation of the mask blank 10 determined in the placing orientation determination process for the writing stage of the exposure/writing apparatus 102. In this manner, the mask inspection apparatus 106 orients the photomask 50 in the direction corresponding to the placing orientation of the mask blank 10 at the time of the exposure/writing.

Then, the mask inspection apparatus 106 causes the robot arm to place the photomask 50 on the inspection stage of the mask inspection apparatus 106 while maintaining the orientation thereof as it is and then performs a mask inspection process (S208). In the mask inspection process, the mask inspection apparatus 106 collates the mask pattern 40 of the photomask 50 formed by the patterning with the mask pattern 62 in the pattern data 60 obtained as the inspection pattern data.

Then, the mask inspection apparatus 106 performs a mask orientation restoration process (S210). In the mask orientation restoration process, the mask inspection apparatus 106 causes the robot arm to remove the photomask 50 from the inspection stage and place it on the mask placing portion and then to perform rotation control to restore the orientation of the identification marker 18 to the state before the mask orientation correction process. Further, in the mask orientation restoration process of this example, the mask inspection apparatus 106 causes the robot arm to place the photomask 50 with the restored orientation into the case 30 while maintaining the orientation thereof as it is.

According to this example, it is possible, for example, to properly rotate the photomask 50 before the mask inspection of the photomask 50 so as to agree with the orientation of the mask blank 10 at the time of the exposure/writing. This makes it possible to properly carry out the mask inspection, for example.

Figure 7:
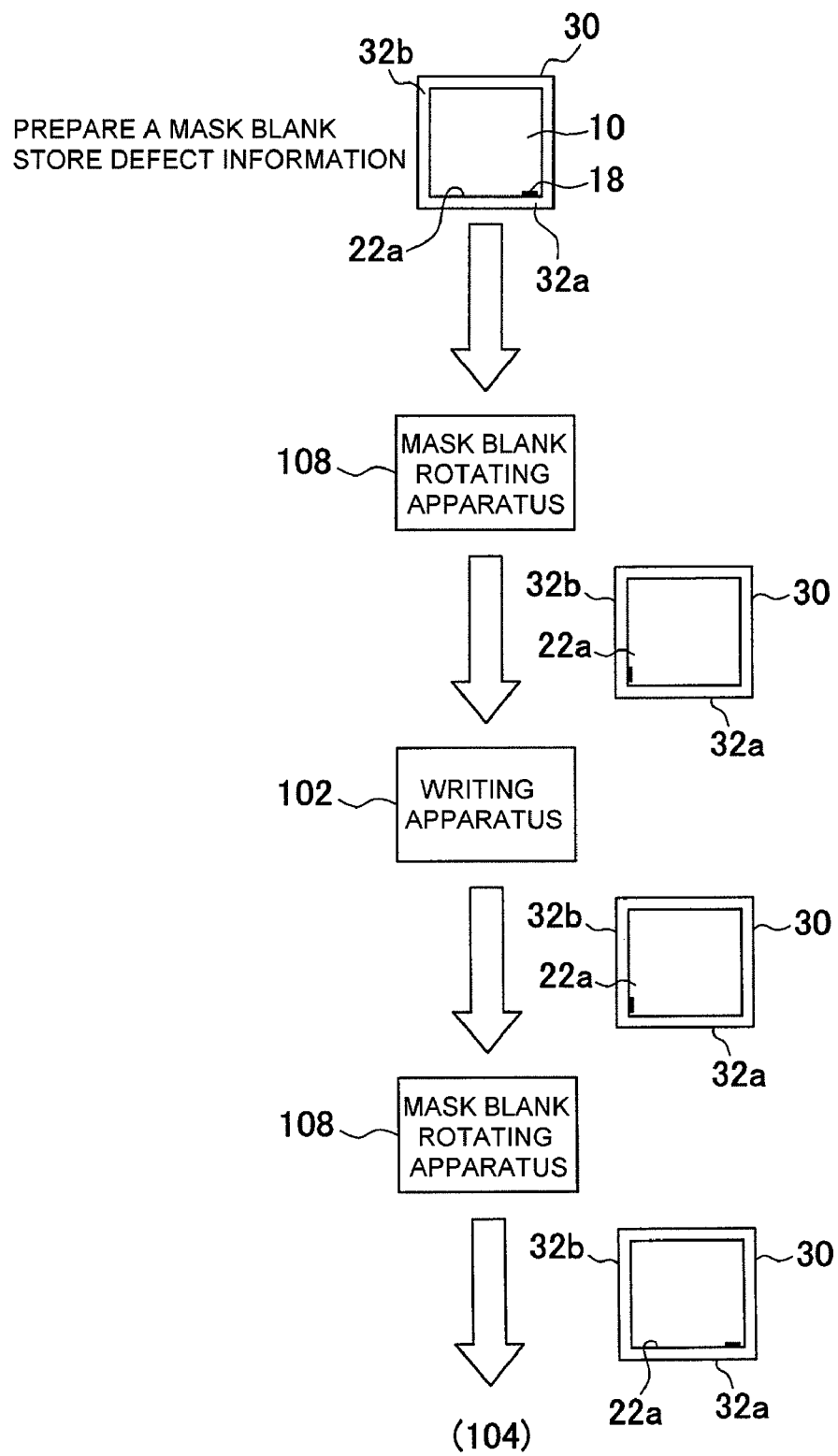
FIG. 7 is a diagram showing a second example of a photomask manufacturing process.

FIG. 7 shows a second example of the photomask manufacturing process. Except what will be described below, the photomask manufacturing process of this example is the same as or similar to the photomask manufacturing process described with reference to FIGS. 3 to 6.

In the photomask manufacturing process of this example, the rotation of a mask blank 10 before and after exposure/writing of a mask pattern is carried out using a mask blank rotating apparatus (rotating apparatus) 108 provided on the exterior (offline) of an exposure/writing apparatus 102. As the mask blank rotating apparatus 108, it is preferable to use a robot arm having a mask blank placing portion on which the mask blank 10 can be placed. The mask blank rotating apparatus may be configured as a rotary table provided with a rotary driving apparatus, but in this case, an apparatus for taking the mask blank 10 out of a case 30 and placing it on the rotary table is separately required. The mask blank rotating apparatus 108 has a sensor that is the same as or similar to the sensor 202 described with reference to FIG. 4, for example.

In this case, the mask blank rotating apparatus 108 performs, for example, a placing orientation determination process and an orientation correction process among the respective processes described with reference to FIGS. 3 and 4. Then, the mask blank rotating apparatus 108 places the mask blank 10 after the rotation into the case 30, for example, in the rotated state and delivers it to the exposure/writing apparatus 102. The mask blank rotating apparatus 108 may carry out these processes, for example, by the same or similar methods as those implemented by the exposure/writing apparatus 102 in the placing orientation determination process and the orientation correction process described with reference to FIGS. 3 and 4.

Then, the exposure/writing apparatus 102, in receipt of the mask blank 10 after the rotation from the mask blank rotating apparatus 108, performs a writing process. In this case, the exposure/writing apparatus 102 takes the mask blank 10, received from the mask blank rotating apparatus 108, out of the case 30 and then performs exposure/writing of a mask pattern. The exposure/writing apparatus 102 places the mask blank 10 after the exposure/writing into the case 30 again and delivers it to the mask blank rotating apparatus 108.

Then, the mask blank rotating apparatus 108, in receipt of the mask blank 10 after the exposure/writing, takes the mask blank 10 out of the case 30 and then performs an orientation restoration process, for example, by the same or similar method as that implemented by the exposure/writing apparatus 102 in the orientation restoration process described with reference to FIGS. 3 and 4. After the orientation restoration process, the mask blank rotating apparatus 108 delivers the mask blank 10, placed in the case 30, to a patterning apparatus 104. Subsequently, respective processes will be carried out, for example, in the same or similar manner as the processes described with reference to FIG. 3.

According to this example, it is possible, for example, to properly carry out the rotation of the mask blank 10 before the exposure/writing without providing a rotary table or the like in the exposure/writing apparatus 102. Further, it is possible to properly prevent occurrence of a problem in reading an identification marker 18 in the subsequent processes.

An apparatus that is the same as or similar to the mask blank rotating apparatus 108 may be used as a mask rotating apparatus before and after a mask inspection process performed in a mask inspection apparatus 106 (see FIG. 3). This mask rotating apparatus is, for example, an apparatus having a mask rotating table provided with a rotary driving apparatus and serves to rotate a photomask 50 in a mask orientation correction process and a mask orientation restoration process. With this structure, it is possible, for example, to properly carry out the mask inspection process without providing a mask rotating table or the like in the mask inspection apparatus 106.

While this invention has been described in terms of the embodiment, the technical scope of this invention is not limited thereto. It is readily understood by a person skilled in the art that various modifications or improvements can be added to the foregoing embodiment. It is apparent from the description of the claims that the modes added with those modifications or improvements can also be included in the technical scope of this invention.

What is claimed is:

1. A photomask manufacturing method of placing, on a placing portion of a rotating apparatus, a mask blank formed by stacking a mask pattern thin film and a resist film on a substrate in this order, placing the mask blank in an exposure/writing apparatus while controlling an orientation of the mask blank using the rotating apparatus, and exposing/writing a mask pattern in the resist film using the exposure/writing apparatus, the method comprising:
   a defect information storage step of storing defect information into an information storage device in correspondence to an identification marker, the defect information including a type of a defect about at least one of the substrate, the mask pattern thin film, and the resist film in the mask blank provided with the identification marker on at least one end face of the substrate, and a position of the defect specified using a position of the identification marker as a reference;
   a placing orientation determination step of determining a placing orientation of the mask blank with respect to the exposure/writing apparatus using an orientation of the identification marker as a reference; and
   an orientation correction step of performing rotation control of the rotating apparatus using the orientation of said identification marker as a reference so that an orientation of the mask blank on the placing portion coincides with the placing orientation determined in the placing orientation determination step,
   wherein the placing orientation determination step detects the identification marker of the mask blank placed on the placing portion using a sensor, refers to the information storage device to obtain the defect information, and determines, based on writing information of the mask pattern to be exposed/written by the exposure/writing apparatus and the defect information, the placing orientation that achieves an arrangement of the mask pattern on the substrate in which the defect does not adversely affect a pattern transfer function of a photomask produced from the mask blank.

2. The photomask manufacturing method according to claim 1, further comprising an orientation restoration step of placing, on the placing portion, the mask blank subjected to exposure/writing of the mask pattern in the resist film using said exposure/writing apparatus and performing rotation control of the rotating apparatus to restore the orientation of the identification marker to a state before the orientation correction step.

3. The photomask manufacturing method according to claim 2, further comprising:
   an inspection pattern data transmission step of placing, on a mask placing portion of a mask rotating apparatus, the photomask produced by developing the resist film after the exposure/writing of the mask pattern and etching the mask pattern thin film, detecting the identification marker using a sensor, referring to the information storage device to obtain inspection pattern data corresponding to the photomask, and transmitting the inspection pattern data to a mask inspection apparatus; and
   a mask orientation correction step of performing rotation control of the mask rotating apparatus using the orientation of the identification marker as a reference so that an orientation of the photomask on the mask placing portion coincides with the placing orientation of the mask blank determined in the placing orientation determination step.

4. The photomask manufacturing method according to claim 3, further comprising a mask orientation restoration step of placing, on the mask placing portion, the photomask subjected to a mask inspection using the mask inspection apparatus and performing rotation control of the mask rotating apparatus to restore the orientation of the identification marker to a state before the mask orientation correction step.

5. The photomask manufacturing method according to claim 1, wherein the identification marker is formed by arranging a plurality of pits in a two-dimensional form on the end face of the substrate.

6. The photomask manufacturing method according to claim 1, wherein the substrate is made of any one of a synthetic quartz glass, a low thermal expansion glass, a crystallized glass and a soda-lime glass.

7. An EUV exposure-reflective mask manufacturing method of placing, on a placing portion of a rotating apparatus, a mask blank formed by stacking a mask pattern thin film and a resist film on a substrate in this order and applicable to an EUV exposure-reflective mask, placing the mask blank in an exposure/writing apparatus while controlling an orientation of the mask blank using the rotating apparatus, and exposing/writing a mask pattern in the resist film using the exposure/writing apparatus, the method comprising:

a defect information storage step of storing defect information into an information storage device in correspondence to an identification marker, the defect information including a type of a defect about at least one of the substrate, the mask pattern thin film, and the resist film in the mask blank provided with the identification marker on at least one end face of the substrate, and a position of the defect specified using a position of the identification marker as a reference;

a placing orientation determination step of determining a placing orientation of the mask blank with respect to the exposure/writing apparatus using an orientation of the identification marker as a reference; and an orientation correction step of performing rotation control of the rotating apparatus using the orientation of said identification marker as a reference so that an orientation of the mask blank on the placing portion coincides with the placing orientation determined in the placing orientation determination step, wherein the placing orientation determination step detects the identification marker of the mask blank placed on the placing portion using a sensor, refers to the information storage device to obtain the defect information, and determines, based on writing information of the mask pattern to be exposed/written by the exposure/writing apparatus and the defect information, the placing orientation that achieves an arrangement of the mask pattern on the substrate in which the defect does not adversely affect a pattern transfer function of the EUV exposure-reflective mask produced from the mask blank.

8. The EUV exposure-reflective mask manufacturing method according to claim 7, further comprising an orientation restoration step of placing, on the placing portion, the mask blank subjected to exposure/writing of the mask pattern in the resist film using said exposure/writing apparatus and performing rotation control of the rotating apparatus to restore the orientation of the identification marker to a state before the orientation correction step.

9. The EUV exposure-reflective mask manufacturing method according to claim 8, further comprising:

an inspection pattern data transmission step of placing, on a mask placing portion of a mask rotating apparatus, the EUV exposure-reflective mask produced by developing the resist film after the exposure/writing of the mask pattern and etching the mask pattern thin film, detecting the identification marker using a sensor, referring to the information storage device to obtain inspection pattern data corresponding to the EUV exposure-reflective mask, and transmitting the inspection pattern data to a mask inspection apparatus; and a mask orientation correction step of performing rotation control of the mask rotating apparatus using the orientation of the identification marker as a reference so that an orientation of the EUV exposure-reflective mask on the mask placing portion coincides with the placing orientation of the mask blank determined in the placing orientation determination step.

10. The EUV exposure-reflective mask manufacturing method according to claim 9, further comprising a mask orientation restoration step of placing, on the mask placing portion, the EUV exposure-reflective mask subjected to a mask inspection using the mask inspection apparatus and performing rotation control of the mask rotating apparatus to restore the orientation of the identification marker to a state before the mask orientation correction step.

11. The EUV exposure-reflective mask manufacturing method according to claim 7, wherein the identification marker is formed by arranging a plurality of pits in a two-dimensional form on the end face of the substrate.

12. The EUV exposure-reflective mask manufacturing method according to claim 7, wherein the substrate is made of any one of a synthetic quartz glass, a low thermal expansion glass, a crystallized glass and a soda-lime glass.

* * * * *